United States Patent [19]

Nunziata

[11] Patent Number: 5,737,572
[45] Date of Patent: Apr. 7, 1998

[54] BANK SELECTION LOGIC FOR MEMORY CONTROLLERS

[75] Inventor: Ann B. Nunziata, Cupertino, Calif.

[73] Assignee: Apple Computer, Inc., Cupertino, Calif.

[21] Appl. No.: 470,963

[22] Filed: Jun. 6, 1995

[51] Int. Cl.⁶ ................................. G06F 12/00
[52] U.S. Cl. ........................... 395/484; 395/405
[58] Field of Search ............... 395/484, 497.01, 395/497.03, 405

[56] References Cited

U.S. PATENT DOCUMENTS

| | | | |
|---|---|---|---|
| 4,924,375 | 5/1990 | Fung | 395/484 |
| 4,926,314 | 5/1990 | Dhuey | 395/497.03 |
| 5,040,153 | 8/1991 | Fung | 365/230.03 |
| 5,179,686 | 1/1993 | White | 395/497.03 |
| 5,241,643 | 8/1993 | Durkin | 395/442 |
| 5,269,010 | 12/1993 | MacDonald | 395/425 |
| 5,278,801 | 1/1994 | Dresser et al. | 365/230.02 |
| 5,301,278 | 4/1994 | Rowater | 395/405 |
| 5,303,364 | 4/1994 | Mayer et al. | 395/425 |
| 5,307,320 | 4/1994 | Farrer et al. | 365/230.01 |
| 5,341,494 | 8/1994 | Thayer et al. | 395/425 |
| 5,353,423 | 10/1994 | Hamid et al. | 395/425 |
| 5,371,866 | 12/1994 | Cady | 395/400 |
| 5,375,084 | 12/1994 | Begun | 365/63 |
| 5,386,383 | 1/1995 | Raghavachari | 365/189.05 |
| 5,572,692 | 11/1996 | Murdoch | 395/405 |

OTHER PUBLICATIONS

*AM29022™ RISC Microcontroller User's Manual and Data Sheet*, pp. 9-1 thru 9-10 (Chapter 9, DRAM Controller) 1991.

*Primary Examiner*—Tod R. Swann
*Assistant Examiner*—Christopher S. Chow
*Attorney, Agent, or Firm*—Burns, Doane, Swecker & Mathis, L.L.P.

[57] ABSTRACT

A system and method for controlling DRAM is described. According to exemplary embodiments of the present invention, a memory subsystem can be populated by end users with any of a variety of DRAM chips. A memory controller will size each memory bank and determine whether paired memory banks are to be configured as interleaved or non-interleaved based upon the detected DRAM population. Bank selection logic is designed to account for both size and status (interleaved or non-interleaved) when determining which memory bank contains a memory location of interest. Row and column addressing is selected to minimize decoding of an incoming system address and reduce DRAM access time.

9 Claims, 16 Drawing Sheets

| Bank | Physical Bank Size | Base Memory Location (Limit reg) | Description |
|---|---|---|---|
| 0 | 1 MByte | 000100 | next lowest |
| 1 | 0 MByte | 000101 | empty |
| 2 | 4 MByte | 000000 | lowest bank in space |
| 3 | 0 MByte | 000101 | empty |

FIG. 3A

| Bank | Physical Bank Size | Base Memory Location (Limit reg) | Description |
|---|---|---|---|
| 0 | 1 | 001000 | non-interleaved |
| 1 | 4 | 000000 | non-interleaved |
| 2 | 4 | 000100 | non-interleaved |
| 3 | 0 | 001001 | empty |

FIG. 3B

| Bank | Physical Bank Size | Base Memory Location (Limit reg) | Description |
|---|---|---|---|
| 0 | 4 | 000000 | interleaved |
| 1 | 4 | 000000 | interleaved |
| 2 | 1 | 001000 | non-interleaved |
| 3 | 0 | 001001 | empty |

FIG. 3C

| Bank | Physical Bank Size | Base Memory Location (Limit reg) | Description |
|---|---|---|---|
| 0 | 1 | 001101 | non-interleaved |
| 1 | 4 | 001000 | non-interleaved |
| 2 | 4 | 000000 | interleaved |
| 3 | 4 | 000000 | interleaved |

FIG. 3D

| DRAM density | DRAM width | PORTION of cycle | DRAM multiplexed address bits |||||||||||
|---|---|---|---|---|---|---|---|---|---|---|---|---|---|
| | | | 10 | 9 | 8 | 7 | 6 | 5 | 4 | 3 | 2 | 1 | 0 |
| 1 Mbit | 16 bits | RAS | | | a18 | a17 | a16 | a15 | a14 | a13 | a12 | a11 | a10 |
| | | CAS | | | a9 | a8 | a7 | a6 | a5 | a4 | a3 | a2 | a1 |
| | 32 bits | RAS | | | a19 | a18 | a17 | a16 | a15 | a14 | a13 | a12 | a11 |
| | | CAS | | | a10 | a9 | a8 | a7 | a6 | a5 | a4 | a3 | a2 |
| 4 Mbit | 16 bits | RAS | | a19 | a18 | a17 | a16 | a15 | a14 | a13 | a12 | a11 | a10 |
| | | CAS | | a20 | a9 | a8 | a7 | a6 | a5 | a4 | a3 | a2 | a1 |
| | 32 bits | RAS | | a20 | a19 | a18 | a17 | a16 | a15 | a14 | a13 | a12 | a11 |
| | | CAS | | a21 | a10 | a9 | a8 | a7 | a6 | a5 | a4 | a3 | a2 |
| 16 Mbit | 16 bits | RAS | a21 | a19 | a18 | a17 | a16 | a15 | a14 | a13 | a12 | a11 | a10 |
| | | CAS | a22 | a20 | a9 | a8 | a7 | a6 | a5 | a4 | a3 | a2 | a1 |
| | 32 bits | RAS | a22 | a20 | a19 | a18 | a17 | a16 | a15 | a14 | a13 | a12 | a11 |
| | | CAS | a23 | a21 | a10 | a9 | a8 | a7 | a6 | a5 | a4 | a3 | a2 |

FIG. 5
(PRIOR ART)

| Memory Address | | Ras Address(RA) | | | | | | | | | | | |
|---|---|---|---|---|---|---|---|---|---|---|---|---|---|
| | | 11 | 10 | 9 | 8 | 7 | 6 | 5 | 4 | 3 | 2 | 1 | 0 |
| 1M$_{bit}$ 9 RA,9 CA | Non-I | | | | 19 | 18 | 17 | 16 | 15 | 14 | 13 | 12 | 11 |
| | Int | | | | 19 | 18 | 17 | 16 | 15 | 14 | 13 | 12 | 11 |
| 4M$_{bit}$ 10 RA,10 CA | Non-I | | | 21 | 19 | 18 | 17 | 16 | 15 | 14 | 13 | 12 | 11 |
| | int | | | 21 | 19 | 18 | 17 | 16 | 15 | 14 | 13 | 12 | 11 |
| 16M$_{bit}$ 11 RA,11 CA | Non-I | | 23 | 21 | 19 | 18 | 17 | 16 | 15 | 14 | 13 | 12 | 11 |
| | Int | | 23 | 21 | 19 | 18 | 17 | 16 | 15 | 14 | 13 | 12 | 11 |
| 16M$_{bit}$ 12 RA,10 CA | Non-I | 22 | 23 | 21 | 19 | 18 | 17 | 16 | 15 | 14 | 13 | 12 | 11 |
| | Int | 22 | 23 | 21 | 19 | 18 | 17 | 16 | 15 | 14 | 13 | 12 | 11 |

FIG. 6(a)

| Memory Address | | CAS Address(CA) | | | | | | | | | | |
|---|---|---|---|---|---|---|---|---|---|---|---|---|
| | | 10 | 9 | 8 | 7 | 6 | 5 | 4 | 3 | 2 | 1 | 0 |
| 1M$_{bit}$ 9 RA,9 CA | Non-I | | | 10 | 9 | 8 | 7 | 6 | 5 | 4 | 3 | 2 |
| | Int | | | 10 | 9 | 8 | 7 | 6 | 5 | 4 | 3 | 20 |
| 4M$_{bit}$ 10 RA,10 CA | Non-I | | 20 | 10 | 9 | 8 | 7 | 6 | 5 | 4 | 3 | 2 |
| | Int | | 22 | 10 | 9 | 8 | 7 | 6 | 5 | 4 | 3 | 20 |
| 16M$_{bit}$ 11 RA,11 CA | Non-I | 22 | 20 | 10 | 9 | 8 | 7 | 6 | 5 | 4 | 3 | 2 |
| | Int | 22 | 24 | 10 | 9 | 8 | 7 | 6 | 5 | 4 | 3 | 20 |
| 16M$_{bit}$ 12 RA,10 CA | Non-I | | 20 | 10 | 9 | 8 | 7 | 6 | 5 | 4 | 3 | 2 |
| | Int | | 24 | 10 | 9 | 8 | 7 | 6 | 5 | 4 | 3 | 20 |

FIG. 6(b)

| Bit(s) | R/W | Name | Description |
|---|---|---|---|
| 31 | R/W | MB16[3] | 16 MB, Bank 3: Value is asserted high if bank 3 is 16 MB. The software should set this bit before sizing the DRAM. Initially 0 or deasserted after RESET_ asserted. |
| 30 | R | Reserved | Always reads 0. |
| 29 | R/W | MB4[3] | 4 MB, Bank 3: Value is asserted high if bank 3 is 4 MB. Initially 0 or deasserted after RESET_ asserted. |
| 28 | R | Reserved | Always reads 0. |
| 27 | R/W | MB1[3] | 1 MB, Bank 3: Value is asserted high if bank 3 is 1 MB. Initially 0 or deasserted after RESET_ asserted. |
| 26 | R/W | MB0[3] | 0 MB, Bank 3: Value is asserted high if bank 3 is not stuffed. Initially 0 or deasserted after RESET_ asserted. |
| 25-24 | R | Reserved | Always reads 0. |
| 23 | R/W | MB16[2] | 16 MB, Bank 2: Value is asserted high if bank 2 is 16 MB. The software should set this bit before sizing the DRAM. Initially 0 or deasserted after RESET_ asserted. |
| 22 | R | Reserved | Always reads 0. |
| 21 | R/W | MB4[2] | 4 MB, Bank 2: Value is asserted high if bank 2 is 4 MB. Initially 0 or deasserted after RESET_ asserted. |
| 20 | R | Reserved | Always reads 0. |
| 19 | R/W | MB1[2] | 1 MB, Bank 2: Value is asserted high if bank 2 is 1MB. Initially 0 or deasserted after RESET_ asserted. |
| 18 | R/W | MB0[2] | 0 MB, Bank 2: Value is asserted high if bank 3 is not stuffed. Initially 0 or deasserted after RESET_ asserted. |
| 16-17 | R | Reserved | Always reads 0. |
| 15 | R/W | MB16[1] | 16 MB, Bank 1: Value is asserted high if bank 1 is 16 MB. The software should set this bit before sizing the DRAM. Initially 0 or deasserted after RESET_ asserted. |
| 14 | R | Reserved | Always reads 0. |
| 13 | R/W | MB4[1] | 4 MB, Bank 1: Value is asserted high if bank 1 is 4 MB. Initially 0 or deasserted after RESET_ asserted. |
| 12 | R | Reserved | Always reads 0. |
| 11 | R/W | MB1[1] | 1 MB, Bank 1: Value is asserted high if bank 1 is 1 MB. Initially 0 or deasserted after RESET_ asserted. |
| 10 | R/W | MB0[1] | 0 MB, Bank 1: Value is asserted high if bank 1 is not stuffed. Initially 0 or deasserted after RESET_ asserted. |
| 8-9 | R | Reserved | Always reads 0. |
| 7 | R/W | MB16[0] | 16 MB, Bank 0: Value is asserted high if bank 0 is 16 MB. The software should set this bit before sizing the DRAM. Initially 0 or deasserted after RESET_ asserted. |
| 6 | R | Reserved | Always reads 0. |
| 5 | R/W | MB4[0] | 4 MB, Bank 0: Value is asserted high if bank 0 is 4 MB. Initially 0 or deasserted after RESET_ asserted. |
| 4 | R | Reserved | Always reads 0. |
| 3 | R/W | MB1[0] | 1 MB, Bank 0: Value is asserted high if bank 0 is 1 MB. Initially 0 or deasserted after RESET_ asserted. |
| 2 | R/W | MB0[0] | 0 MB, Bank 0: Value is asserted high if bank 0 is not stuffed. Initially 0 or deasserted after RESET_ asserted. |
| 1-0 | R | Reserved | Always reads 0. |

FIG. 8A

| Bit(s) | R/W | Name | Description |
|---|---|---|---|
| 31-26 | R | Reserved | Always reads 0. |
| 25 | R/W | HiIntlvd | Hi Bank Interleaved. When this bit is asserted high, it indicates that physical banks 2 and 3 are interleaved. Value = 0 or deasserted after RESET_ asserted. |
| 24 | R/W | LoIntlvd | LoBank Interleaved. When this bit is asserted high, it indicates that physical banks 0 and 1 are interleaved. Value = 0 or deasserted after RESET_ asserted. |
| 23-0 | R | Reserved | Always reads 0. |

FIG. 8B

| Bit(s) | R/W | Name | Description |
|---|---|---|---|
| 31-6 | R | Reserved | Always reads 0. |
| 5-0 | R/W | Limit0 | Bank 0 Limit: If incoming Addresses A25-A20 match this limit register, RAS0 will be asserted. |

FIG. 8C

| Bit(s) | R/W | Name | Description |
|---|---|---|---|
| 31-6 | R | Reserved | Always reads 0. |
| 5-0 | R/W | Limit1 | Bank 1 Limit: If incoming Addresses A25-A20 match this limit register, RAS1 will be asserted. |

FIG. 8D

| Bit(s) | R/W | Name | Description |
|---|---|---|---|
| 31-6 | R | Reserved | Always reads 0. |
| 5-0 | R/W | Limit2 | Bank 2 Limit: If incoming Addresses A25-A20 match this limit register, RAS2 will be asserted. |

FIG. 8E

| Bit(s) | R/W | Name | Description |
|---|---|---|---|
| 31-6 | R | Reserved | Always reads 0. |
| 5-0 | R/W | Limit3 | Bank 3 Limit: If incoming Addresses A25-A20 match this limit register, RAS3 will be asserted. |

FIG. 8F

| bank size | intlvd | mask4 system addr24 | mask3 system addr23 | mask2 system addr22 | mask1 system addr21 | mask0 system addr20 |
|---|---|---|---|---|---|---|
| 0 MB | 0 | 0 | 0 | 0 | 0 | 0 |
|  | 1 | 0 | 0 | 0 | 0 | 0 |
| 1 MB | 0 | 0 | 0 | 0 | 0 | 1 |
|  | 1 | 0 | 0 | 0 | 0 | 1 |
| 2 MB | 0 | 0 | 0 | 0 | 1 | 1 |
|  | 1 | 0 | 0 | 0 | 1 | 1 |
| 4 MB | 0 | 0 | 0 | 1 | 1 | 1 |
|  | 1 | 0 | 0 | 1 | 1 | 1 |
| 8 MB | 0 | 0 | 1 | 1 | 1 | 1 |
|  | 1 | 0 | 1 | 1 | 1 | 1 |
| 16 MB | 0 | 1 | 1 | 1 | 1 | 1 |
|  | 1 | 1 | 1 | 1 | 1 | 1 |

FIG. 10

BANK SELECTION LOGIC FOR MEMORY CONTROLLERS

RELATED APPLICATION

This application is related to U.S. patent application Ser. No. 08/470,971 entitled "Memory Controller for Both Interleaved and Non-Interleaved Memory", which application was filed on the same date as this application, now U.S. Pat. No. 5,619,471.

BACKGROUND

The present invention relates generally to digital data processing devices and, more specifically, to memory controllers in such devices.

Performance demands on digital data processing devices continue to increase at a meteoric pace. For example, in the color printing industry, users demand greater print resolution and color quality. To meet this demand, processors have been developed which operate at higher and higher clock speeds. The instruction sets used to control processors have been pared down (e.g., RISC architecture) to make them more efficient. Processor improvements alone, however, have been insufficient to provide the greater performance required by users. The other subsystems which support the processor, e.g., I/O devices and memory devices, must also be designed to operate at higher speeds and support greater bandwidth. For example, one RISC performance goal is to achieve memory throughput of one data word per clock cycle.

Dynamic random access memory (DRAM) is one of the different types of memory subsystems which are commonly shared in such systems. Recently, DRAM has been provided in the form of memory chips each of which can be inserted into standardized sockets on a printed circuit board. Each memory chip typically includes a matrix array of memory locations each of which can store one or more bits. For example, a 16 megabit DRAM chip could be fabricated as a device having either 16M one-bit locations or a device having 4M four-bit locations. As DRAM fabrication technology has improved, the number of individual memory locations available in each memory chip has rapidly increased. The memory capacity of DRAM chips which are currently in use range from, for example, 256 kilobits to 16 megabits, with larger capacities expected in the future. Note that throughout this specification the abbreviation MB refers to "megabyte" or "megabytes" rather than megabit or megabits.

Each memory location within a DRAM chip has a unique address. In order to perform a memory operation involving a DRAM array, an address identifying the particular location involved in the operation must be sent to the correct DRAM chip(s). Once an incoming address is received by a memory controller, it is first decoded to identify the particular DRAM bank in which the DRAM chip of interest is grouped for addressing purposes. A row address derived from the incoming system address is placed on the DRAM address bus and strobed into the identified DRAM bank in response to a row address strobe (RAS) signal sent from the memory controller selecting the identified DRAM bank. Next, a column address is placed on the DRAM address bus connecting the memory controller and the DRAM and the column address is strobed into the selected DRAM bank by the column address strobe (CAS). These row and column addresses are multiplexed onto a set of address signal lines to reduce the number of lines necessary to address the DRAMs.

As mentioned above, a significant consideration in controlling DRAM is the speed at which data can be retrieved from (or written to) memory. One technique which is commonly used to increase access speed to and from the DRAM is called interleaving. Interleaved memory banks each alternatingly contain adjacent data words which can be accessed in parallel. For example, if a first bank in an interleaved pair contains a data word having a word address of 00001, a second bank in the interleaved pair will contain the adjacent data word having a word address of 00010. Thus, a system request to read these words can be performed by a memory controller more rapidly than if these words were stored sequentially in the same DRAM chip of one DRAM bank.

In addition to access speed, another desirable characteristic in memory subsystems is the provision of a flexible upgrade path. Ideally, a memory controller will be designed to allow end users to add new DRAM chips to the memory subsystems interchangeably with the DRAM chips available at the time that the memory controller was designed. Naturally, from a consumer point of view, flexibility in the upgrade path is a significant factor in considering product life cycle values, since end users will be concerned that new generations of DRAM chips might render the memory controller obsolete. As part of the strategy which allows designers to predict the requirements for controlling new generations of DRAM chips, many standards have been implemented in this area. For example, in the area of DRAM chip design, one standard which has been adopted is the use of row followed by column address multiplexing circuitry between a system bus and the DRAM arrays. Timing of the various address and control signals sent from the memory controller to the DRAM has also been standardized to within predetermined tolerances. To date, however, no known DRAM controllers exist which provide industry standard compatibility and which provide a technique for populating DRAM banks as desired interchangeably and then operating the DRAM in either an interleaved or non-interleaved manner based upon the types the DRAM chips chosen to populate the DRAM banks.

SUMMARY

According to exemplary embodiments of the present invention, memory controllers are provided for determining how DRAM banks have been populated (e.g., with no chips, eight 256K×4-bit DRAM chips, eight 1M×4-bit DRAM chips, or eight 4M×4-bit DRAM chips) and operating upon various banks in either an interleaved manner or a non-interleaved manner based on the detected DRAM population. For example, if paired DRAM banks have been populated with the same size DRAM chips then the memory controller will access those DRAM banks as interleaved. If, on the other hand, paired DRAM banks are populated with different size DRAM chips or if only one bank of the pair is populated, then the memory controller operates on these bank(s) in a non-interleaved fashion.

One exemplary aspect of the present invention relates to a method and system for selecting a bank or banks for each memory access. If a data words to be accessed are stored in a bank which has been configured by the memory controller as non-interleaved, then only that bank is selected and strobed to access the locations of interest. If the data words to be accessed are stored within an interleaved pair of DRAM banks, however, then both banks are selected and strobed.

BRIEF DESCRIPTION OF THE DRAWINGS

The foregoing, and other, objects, features and advantages of the present invention will be more readily understood upon reading the following detailed description in conjunction with the drawings in which:

FIGS. 3(a)-3(d) are charts which describe exemplary memory configurations according to the present invention.

FIG. 5 depicts conventional correspondences between system addresses and row and column addresses, respectively;

FIGS. 6(a) and 6(b) depict correspondences between system addresses and row and column addresses, respectively, accordingly to exemplary embodiments of the present invention;

FIGS. 8(a)-8(f) depict exemplary register configurations used by memory controllers according to exemplary embodiments of the present invention;

FIG. 10 is a chart depicting exemplary mask inputs for various size DRAM modules usable in the bank select logic circuit of FIG. 9;

DETAILED DESCRIPTION

Figure 1:
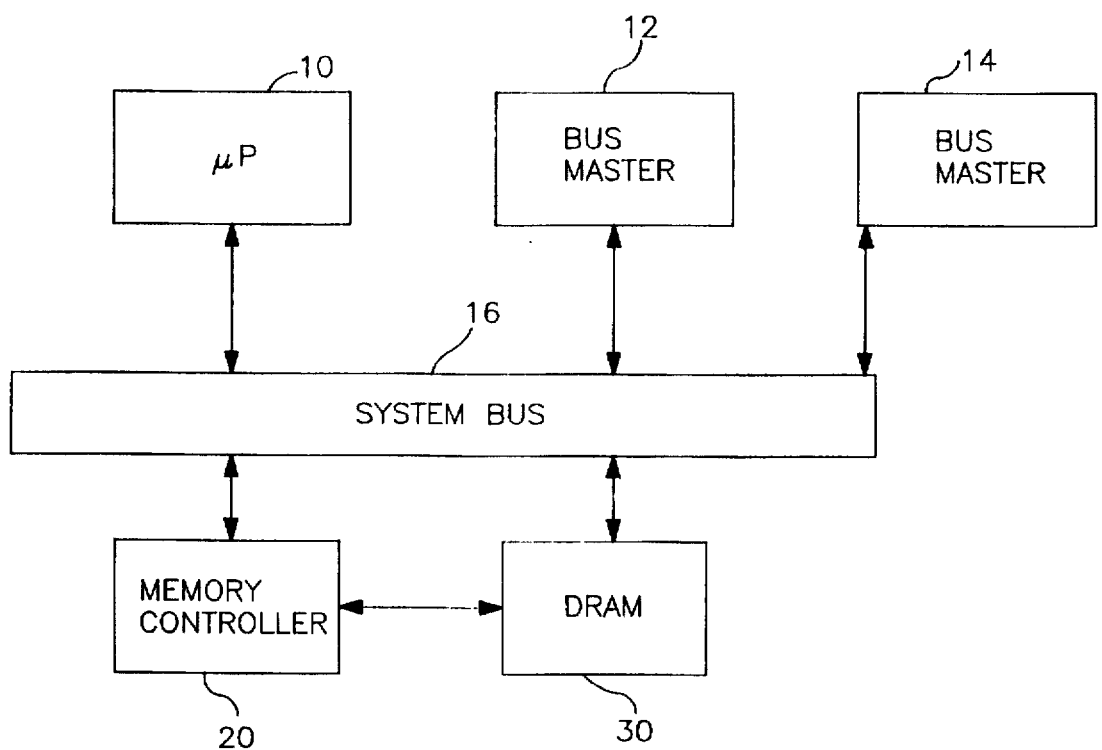
FIG. 1 is a general block diagram representation of an exemplary processing system according to the present invention.

An exemplary embodiment of the present invention will now be described beginning with reference to FIG. 1. This general block diagram illustrates a microprocessor 10 and two other bits masters 12 and 14 which are bidirectionally coupled to a system bus 16. Of course, the present invention can be also applied to systems having more or fewer than three bus masters. In this exemplary embodiment, the system bus 16 includes both an address bus, a data bus and a control bus as is well known in the art. The system bus 16 is also bidirectionally coupled to a memory controller 20 and DRAM 30 so that any of the bus masters 10, 12 and 14 can send requests to write and/or read data from DRAM 30 through memory controller 20.

Memory controller 20 controls accesses (e.g., read and write requests) to DRAM 30. When memory controller 20 receives an access request, it sends address and control signals to DRAM 30 and the DRAM responds by placing data on the system bus 16 (i.e., for a read) or data from the system bus 16 is written into locations in DRAM 30. Those skilled in the art will appreciate that the general block diagram of FIG. 1 is simplified to illustrate only those functional elements of interest in describing the present invention and that other functional elements, such as I/O elements, interfaces, etc., can also be interconnected with the illustrated elements via system bus 16.

Figure 2:
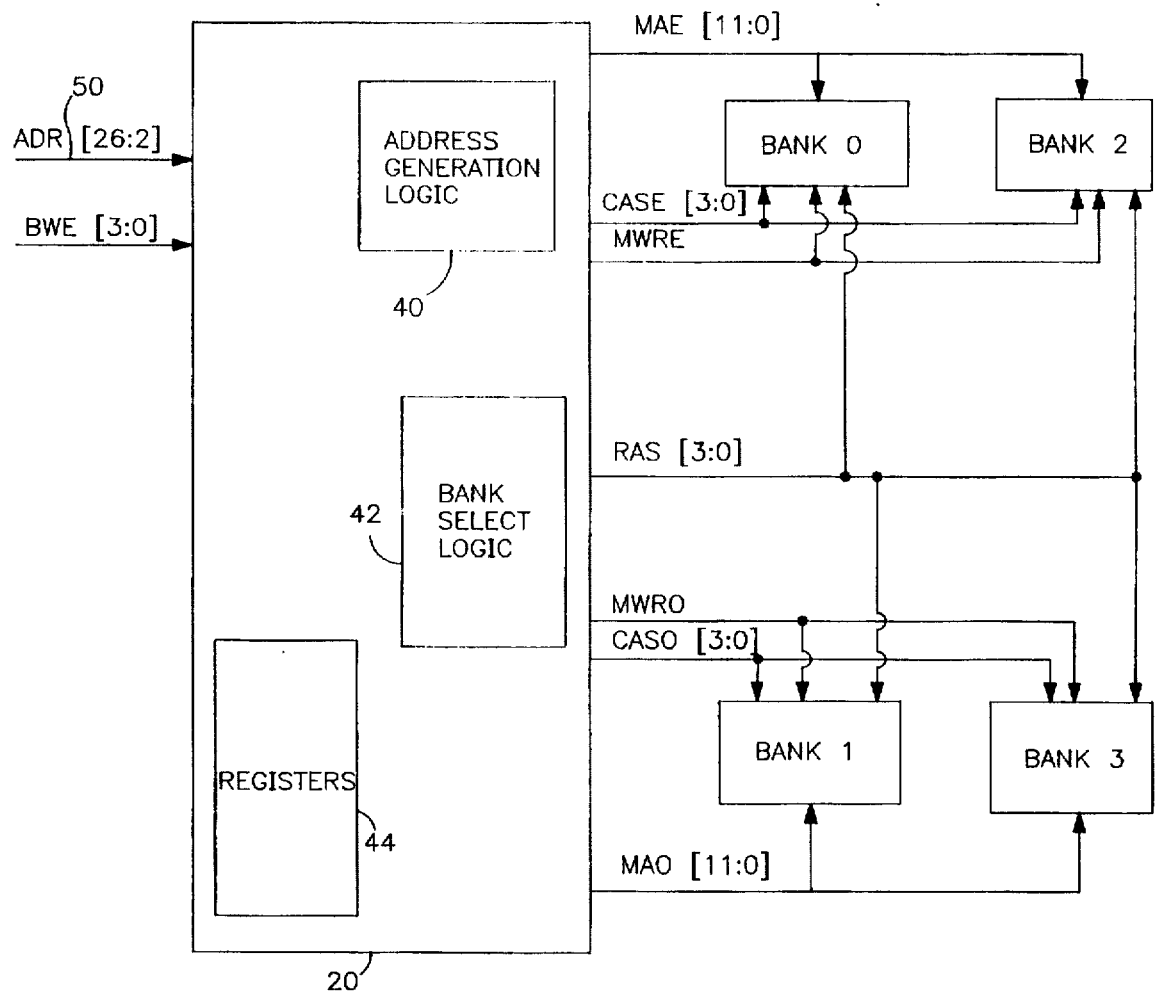
FIG. 2 is a block diagram showing the exemplary memory controller and DRAM of FIG. 1 in more detail.

FIG. 2 illustrates the interconnections between memory controller 20 and DRAM 30 by which memory controller 20 performs the various memory accesses requested by the system of FIG. 1. The DRAM 30 is illustrated in this exemplary embodiment as including four banks of memory, i.e., BANK 0, BANK 1, BANK 2 and BANK 3. Of course, those skilled in the art will understand that more or fewer banks of memory could be used in DRAM 30 and that such an adaption would simply require extending various aspects of this exemplary embodiment such as the width of the various control signal lines, number of registers, etc. Each bank can, for example, be implemented as a single in-line module (SIMM), which are well known, industry standard DRAM modules. Alternatively, each bank can be implemented by soldering associated groups of DRAM chips directly to a printed circuit board. Each bank can, for example, include up to 8 DRAM chips which may each have a capacity of 1 megabit, 4 megabits or 16 megabits. According to exemplary embodiments described herein, each DRAM chip has memory locations which store four bits. Thus, BANK 0 could be implemented to provide 4 MB of memory using eight, 1 megabit×4-bit DRAM chips.

Each of BANKS 0, 1, 2, and 3 may be populated or unpopulated to provide various desired DRAM configurations. When BANK 0 and BANK 1 are both populated to provide the same memory capacity, then memory controller 20 will operate on those two banks in an interleaved manner, e.g., by retrieving (or writing) every other data word from alternating banks in an interleaved pair. Similarly, memory controller 20 will operate on BANK 2 and BANK 3 in an interleaved fashion when those two DRAM banks are populated with the same size DRAM chips. When the paired banks are not populated with the same size DRAM chips (or one of the DRAM banks is empty), then memory controller 20 will operate upon each populated bank in a non-interleaved manner as will be described in more detail below. The tables illustrated in FIGS. 3(a)-3(d) each illustrate various exemplary memory bank configurations. For example, the configuration depicted by the table of FIG. 3(a) shows a 1 MB SIMM in BANK 0 and a 4 MB SIMM in BANK 2. BANKS 1 and 3 are unpopulated in the example of FIG. 3(a). Although not mentioned in the "Description" column of FIG. 3(a), BANKS 0 and 2 would not be configured as interleaved because they are not one of the predetermined pairs, e.g., BANKS 0 and 1 and BANKS 2 and 3, which have been designated for potential interleaving. Moreover, these banks are not populated to be of the same size.

FIG. 3(b) illustrates the case where BANKS 1 and 2 are of the same physical size, but again do not constitute a predetermined pair of banks which may be interleaved. Note that in the example of FIG. 3(b), BANKS 0 and 1 cannot be interleaved since they are of a different size, and BANKS 2 and 3 cannot be interleaved since BANK 3 is unpopulated. FIG. 3(c) shows the case where the pair of BANKS 0 and 1 have been populated with the same size DRAM chips and, accordingly, are configured by the memory controller as interleaved. FIG. 3(d) shows the case where all of the banks are populated and the pair of BANKS 2 and 3 are configured to be interleaved. Those skilled in the art will understand that the exemplary pairings set forth in these illustrative embodiments can be changed to any desired pairing. Moreover, one paired bank could be designated while other banks could remain unassociated and operated upon in an noninterleaved manner at all times. The significance of the "Base Memory Location (Limit Reg.)", and the corresponding description column of FIG. 3(a), will be explained below.

FIG. 2 also illustrates exemplary address and control signal lines connected between memory controller 20 and each of BANKS 0–3. For multi-bit signal lines, an exemplary line width is indicated in the form, e.g., "[11:0]," which denotes a 12-bit signal line. Those skilled in the art will appreciate that the width of each of these signal lines is purely for the purposes of illustrating this exemplary embodiment and that other bit width signal lines may be provided to support other embodiments. For example, DRAM modules larger than 16 MB may require address signal lines having more than a 12 bit width. The MAE address signal lines are used by memory controller 20 to drive the even DRAM memory banks, i.e., BANK 0 and BANK 2. Similarly, the MAO address signal lines are used by memory controller 20 to drive the odd DRAM memory banks, i.e., BANK 1 and BANK 3. By providing two sets of address signal lines, MAE and MAO, addresses can be rapidly presented in an alternating manner to each bank in a pair when those banks are configured to operate in an interleaved manner. Control lines CASE provide a column address strobe signal to BANK 0 and BANK 2. Similarly, memory controller 20 can provide a column address strobe signal to BANK 1 and BANK 3 using control signal lines CASO. A row address strobe signal is selectively provided to any of BANKS 0–3 over the RAS signal line. Write enable control is provided to the even banks via signal line MWRE and to the odd banks by signal line MWRO. Memory controller 20 uses those control signal lines to indicate to DRAM 30 whether an operation is a write or a read. The way in which these address and control lines are used to signal the DRAM banks to support either interleaved or non-interleaved memory operations will now be described by way of illustrative examples.

Figure 4:
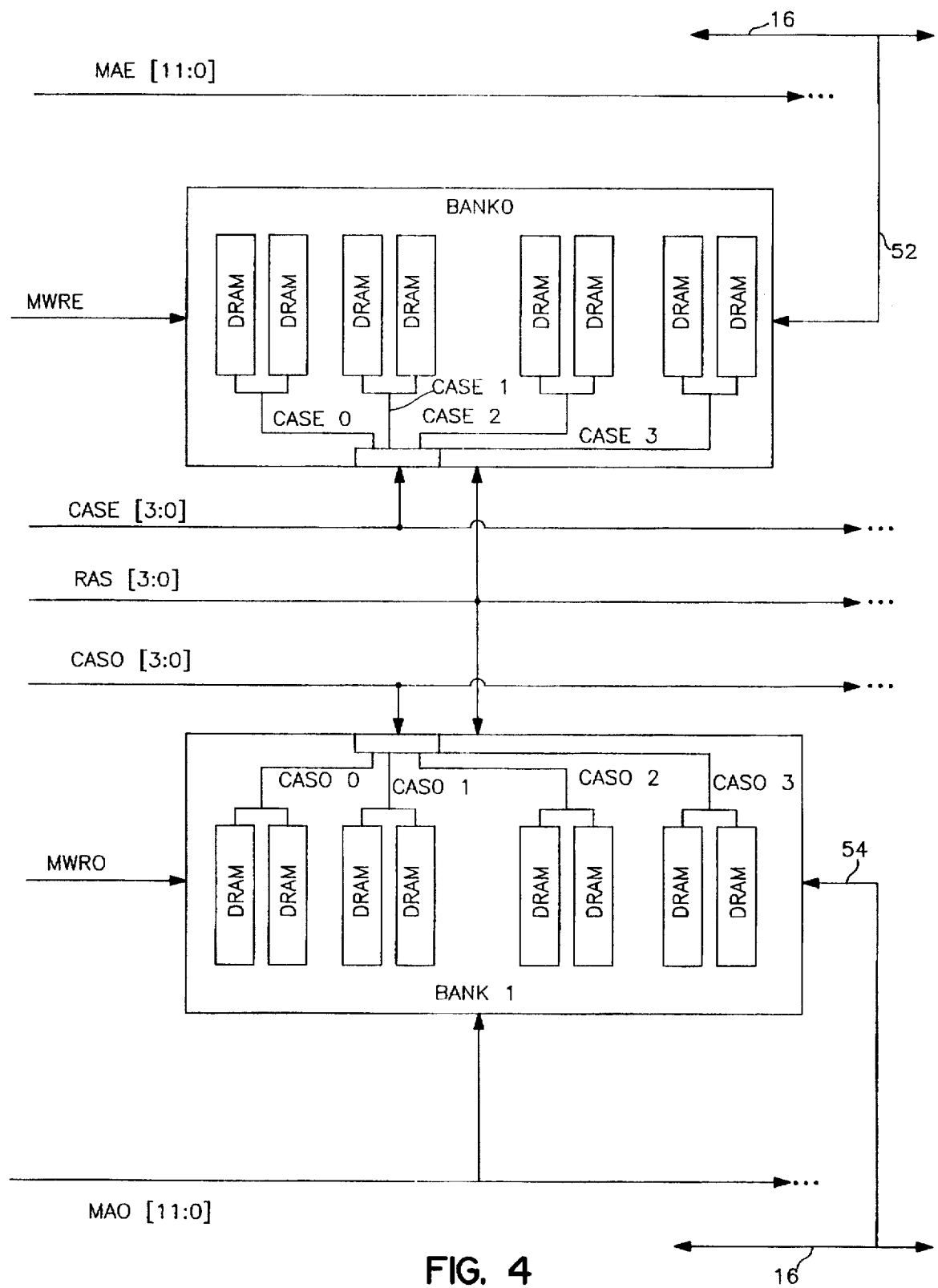
FIG. 4 depicts exemplary signal line connections between two DRAM banks and a memory controller.

FIG. 4 illustrates the portion of DRAM 30 including BANK 0 and BANK 1 in more detail. In this exemplary embodiment each bank is populated with eight DRAM chips, each of which is arranged so that a memory location consists of 4-bits locations. Accordingly, each DRAM chip within each bank is paired to provide for selective byte addressing using the address and control lines illustrated in FIG. 4. Consider, as a first example, that BANK 0 and BANK 1 are populated with DRAM chips such that they have a different memory capacity and are, therefore, configured by memory controller 20 to operate in a non-interleaved manner. This configuration can, for example, be performed at system initialization as described in more detail below. Memory controller 20 then receives a read request from microprocessor 10 which provides an address on system bus portion 50 which identifies a memory location in DRAM 30 that is currently storing the first word requested by microprocessor 10. A portion of this address is decoded by bank select logic 42 to identify which bank (or banks if interleaved banks are identified) contain(s) this memory location. A detailed description of the operation of bank select logic 42 is set forth below with respect to FIGS. 9 and 10. For the purposes of this example, however, suppose that BANK 0 is identified by bank select logic 42 as containing the memory location of interest for this read operation.

While the system address supplied by microprocessor 10 on bus portion 50 is being decoded by bank select logic 42, a portion of this system address corresponding to the row address is placed on address signal lines MAE and MAO by address generation logic 40. Although the details of address multiplexing according to exemplary embodiments of the present invention are described below in more detail, it is worth noting here that one feature of the present invention permits the row address to be placed directly on the address signal lines MAE and MAO in the first clock cycle after receipt of the system address by memory controller 20.

Once the bank select logic 42 identifies the bank containing the memory location of interest, the appropriate RAS signal line is driven to select the identified bank. In this example, RAS 0 is driven to select BANK 0. The RAS 0 signal also strobes the row address on the MAE address signal lines into the DRAM chips of BANK 0. Next, the column address is placed on signal address lines MAE by address generation logic 40. This column address is then strobed into each DRAM chip pair in BANK 0 by driving each of control signal lines CASE [3:0]. Application of the column address to the DRAM chips is sufficient to uniquely identify the word in the selected DRAM bank and this word is then driven onto data path 52 which supplies the requested data word to microprocessor 10. Note that in FIG. 4, the interconnection between BANK 0 and BANK 1 and the system bus 16 have been illustrated by way of illustrative data paths 52 and 54. These data paths can, for example, comprise a single data bus having external latches which interface the memory banks from the system bus 16. Alternatively, data could also be passed back through memory controller 20.

Having described an example of signaling from memory controller 20 to DRAM 30 for the non-interleaved case, an example will now be provided to describe signaling when accessing banks which have been configured by memory controller 20 to operate in an interleaved manner. Suppose that microprocessor 10 instructs memory controller 20 to write data to a memory location that is within the range stored in interleaved DRAM BANK 0 and BANK 1. In this case, address generation logic 40 passes a row address (taken from predetermined address bits supplied on system bus portion 50) onto address signal lines MAE and MAO. Again, it should be noted that the same bits of the system address are passed through to address signal lines MAE and MAO for the interleaved case as for the non-interleaved case. Thus, address generation logic 40 need not decode the incoming address based upon, for example, whether the memory location of interest is within an interleaved or non-interleaved portion of DRAM 30 to determine the row address.

At the same time, the incoming address is decoded by bank select logic 42 to identify the DRAM bank(s) which store the memory location which is to be written. In this example, bank select logic 42 will identify both BANK 0 and BANK 1 since the memory location of interest falls within range of memory addresses which are stored in these interleaved DRAM banks. Then, RAS 0 and RAS 1 will be driven to select both of the interleaved banks. These RAS control lines can either be driven at the same time or sequentially staggered depending upon design considerations, such as power consumption.

Once the DRAM bank or banks have been selected and the row addresses strobed into the DRAM chips in each bank from address signal lines MAE and MAO, then the column address is multiplexed onto address signal lines MAE and MAO. Assuming, for the purposes of this example, that the words to be written into DRAM 30 begin with a word stored in BANK 0, then control signal lines CASE [3:0] would be driven so that the DRAM chip pairs associated with these control lines are strobed with the column address. The word stored at the unique memory location defined by the row and column address supplied to these DRAM chip pairs in BANK 0 is then overwritten by the data on path 52 received from system bus 16. The next word to be written in this memory write operation would then be stored in a similar manner in BANK 1. As will be described in more detail below, system address bit number 2 can be used to indicate which bank in an interleaved pair is to receive the column address strobe for each interleaved access.

The foregoing describes an example of full word write operations in an interleaved portion of the address space. However, partial word write operations can be supported by memory controllers according to exemplary embodiments of the present invention using, for example, the byte write enable control signal lines (BWE [3:0]) illustrated in FIG. 2. The BWE [3:0] control signal lines can be used to generate signals on one or more corresponding CASE [3:0] to select byte(s) to be written. Those skilled in the art will appreciate that when BANK 0 and BANK 1 are configured by memory controller 20 to be interleaved on a word-by-word basis, adjacent partial words will be stored in the same bank.

Having described signaling from the perspective of the DRAM 30, the way in which the aforedescribed address and control signals are generated by the address generation logic 40 and bank select logic 42 of memory controller 20 to perform a desired memory access will now be discussed. For each memory access a row address followed by a column address will be placed upon the appropriate address signal lines MAE and/or MAO. Each row and column address includes a sufficient number of bits to uniquely identify each location in each of BANKS 0-3. Thus, if BANK 0 contained 1 MB of memory arranged in 4-bit locations, then it could be accessed, for example, using a row address of 9 bits and a column address of 9 bits. Similarly, a 4 MB bank can be addressed using row and column addresses of 10 bits. A 16 MB bank can be accessed using row and column addresses of 11 bits each or a 12 bit row address and a 10 bit column address. Each of the row and column address bits is supplied to the memory controller 20 over the system bus portion 50. In the exemplary embodiment of FIG. 2, address bits numbered 26 through 2 are supplied to memory controller 20 which provide sufficient information to the memory controller 20 for selection of the bank (or banks if interleaved) containing the memory location of interest and provision of both the row and column address. Although many aspects of DRAM control have been standardized to enhance compatibility between products, the selection of a particular correspondence between the address bits supplied to memory controller 20 and the bits which comprise the row and column addresses asserted to the DRAM 30 has been left to the designer of the memory controller. For example, a conventional memory controller, known as the AMD 29200, uses the correspondence illustrated in FIG. 5 for the row and column addresses. Therein, it can be seen that bits 19-11 of the incoming system address are used as the 9 bit row address and bits 10-2 of the system address are used as the column address to address a 1 megabit symmetric DRAM chip having a 32-bit word size. To expand addressing to handle symmetric 4 megabit DRAMS (32-bit width), this conventional scheme uses bit number 20 of the system address as the tenth row address bit and bit number 21 of the system address as the tenth column address bit. Similarly, a symmetric 16 megabit DRAM (32-bit width) can be addressed by this conventional memory controller using bit number 22 of the incoming address as the eleventh row address bit and bit number 23 as the eleventh column address bit, i.e., bit number 10.

This conventional memory controller, however, supports only non-interleaved memory. According to exemplary embodiments of the present invention, bit correspondence between the system address input to memory controller 20 and the row and column address output over address signal lines MAE and MAO can be selected as illustrated in FIGS. 6(a) and 6(b) to support DRAM modules of varying size regardless of whether they are configured as interleaved or non-interleaved. Comparing FIGS. 5 and 6(a), it can be seen that, for the 1 megabit capacity DRAM bank, the row address bit correspondence is the same as that of the conventional memory controller for both interleaved and non-interleaved bank configurations. However, the column address shown in FIG. 6(b) varies between system address bits [10:2] for an access involving non-interleaved portion of DRAM 30 and system address bits [10:3, 20] for an access involving an interleaved portion of DRAM 30. Different system address/column address correspondence is provided for interleaved and non-interleaved memory because when an interleaved portion of memory is to be accessed, an additional bit is needed to determine which of the two interleaved banks is to be column address strobed. Recall from the earlier example that when an interleaved portion of memory is accessed, the row address is first strobed into both of the interleaved banks. Then, depending upon which bank is to be accessed first, either the CASE control signal lines or the CASO control signal lines are driven. According to this exemplary embodiment, bit number 2 of the system address is used to identify which bank is to be column address strobed. Since bit number 2 of the system address is no longer available for the least significant bit of the column address, another bit in the system address must be used to convey this information. As seen in the chart of FIG. 6(b), bit number 20 of the system address is selected to be used as the least significant bit of the column address for an interleaved memory access. This bit is selected so that the industry standard practice of using bits in the system address sequentially is followed and no address locations are skipped. Since bit number 20 of the system address is used for column addresses in an interleaved memory access, this bit cannot also be used for the tenth bit of the row address to support addressing of 4 megabit DRAM chips, as is done in the conventional memory controller described in FIG. 5. Instead, as can be seen in the second row of FIG. 6(a), bit number 21 of the system address is used to convey the tenth row address bit when needed, i.e., to address DRAM chips larger than 1 megabit. Returning to FIG. 6(b), for 4 megabit DRAM chips a non-interleaved column address is provided using bit number 20 of the system address as the tenth column address bit and bit number 2 as the least significant column address bit. However, for column addresses used to strobe interleaved portions of memory, bit number 20 of the system address is again used as the least significant bit of the column address to free bit number 2 for use as the bank indication bit. Since bit 20 is used as the least significant bit of the column address for an interleaved memory access, bit number 22 is then used as the tenth bit of the column address. This same technique is applied to each of the other bit correspondence schemes illustrated for 16 megabit DRAM chips in FIGS. 6(a) and 6(b). As mentioned earlier, a significant advantage provided by row and column addressing according to the present invention is that the row address bits remain the same for each of the various types and configurations (i.e., interleaved or non-interleaved) of DRAM banks which are supported. In this way, the same bits may be passed through the memory controller and placed directly onto the address signal lines MAE or MAO as the row address for each memory access. Since the row address is the first address strobed into the DRAM banks, the ability to pass these bits through the memory controller without decoding them provides the fastest possible DRAM access regardless of whether the memory portion to be accessed is configured in an interleaved or a non-interleaved fashion. An exemplary implementation for placing the row or column addresses illustrated in FIG. 6(a) and 6(b) onto the address buses MAE and MAO is illustrated in FIG. 7.

Figure 7:
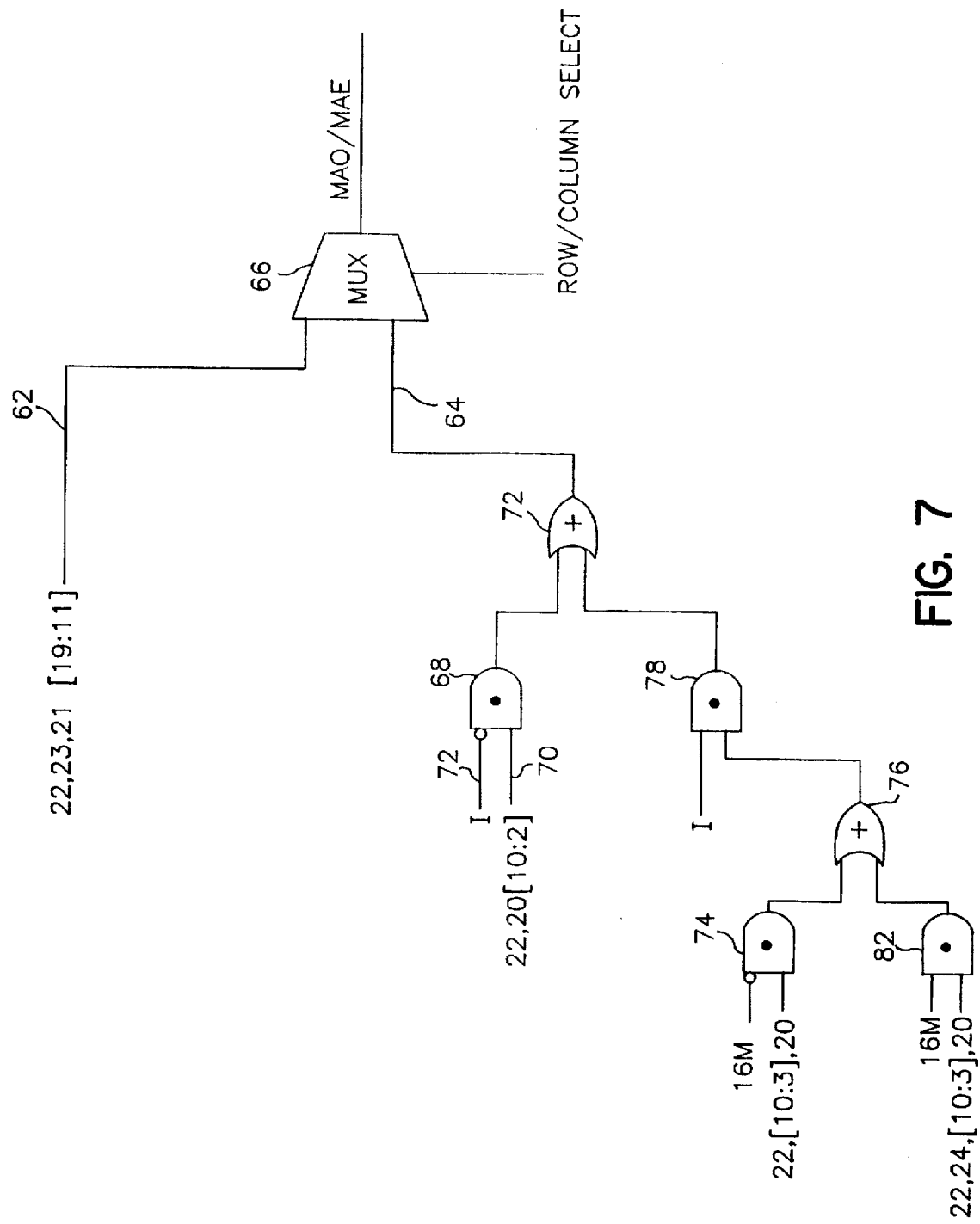
FIG. 7 illustrates exemplary logic for implementing address generation according to an exemplary embodiment of the present invention.

FIG. 7 depicts an exemplary logic circuit for passing the row or column addresses indicated in FIGS. 6(a) and 6(b) onto the address signal lines MAE or MAO. Note therein that the uppermost branch 62 supplies the row address to multiplexer 66 while the lower branch 64 provides the column address to the multiplexer 66. The row/column input to multiplexer 66 selects either the row or column address for placement on the address signal lines. As mentioned above, the row address is the same for each size and configuration (i.e., interleaved or non-interleaved) of DRAM chips in any of the banks. Accordingly, no logic need be used to decode the incoming system address and branch 62 simply passes the listed bits to the multiplexer 66. The column address, on the other hand, does require some decoding in order to determine the bits placed on line 64 and input to the multiplexer 66 since there are eight different column address possibilities listed in the table of FIG. 6(b). Beginning with the uppermost portion of this logic at AND gate 68, this branch provides the listed bits on line 70 to the OR gate 72 when there is no interleaving for the memory access currently being processed, as indicated by the inverter symbol disposed after the interleave input on line 72. As can be seen in FIG. 6(b), the correspondence between the system address bits and the column address bits is the same for all of the different size DRAM chips when there is no interleaving. However, the system address bits used as the column address vary for each size DRAM bank when the memory access involves interleaved DRAM banks.

For example, beginning with the upper branch at AND gate 72, the address bits [22, 10:3,20] are passed through AND gate 74 and OR gate 76 when either a 1 MB or a 4 MB DRAM bank is involved in the memory access, i.e., if a 16 MB DRAM bank is not involved in the memory access in this exemplary embodiment. This logic can be used to combine column addressing for the 1 MB and 4 MB DRAM banks since 1 MB DRAM banks do not use bits higher than the ninth significant bit of the column address. Then, if there is interleaving, these system address bits pass through AND gate 78 and ultimately appear on line 64 as the column address. Similarly, if the DRAM involved in the memory access is of the 16 MB size, then the address bits input to AND gate 82 pass through the gates 82 and 76 and ultimately appear on signal line 64 when an interleaved portion of the memory is being accessed.

In order to implement the logic illustrated in FIG. 7, certain inputs are required in addition to the address bits listed therein. For example, the size and the interleaving status of the DRAM bank being accessed are both inputs to this logic circuit. Accordingly, the registers 44 of memory controller 20 will now be described to complete the discussion of the address logic generation circuit 40.

Memory controller 20 includes, for example, a size register, an interleaving register, and a plurality of limit registers each associated with one of the DRAM BANKS 0–3. At initialization of the system, the microprocessor 10 surveys the DRAM 30 using conventional software to determine the size of the DRAM banks which populate each of those banks or to determine empty banks. This procedure is well known in the art and, accordingly, will not be further described here. The size information is then stored in a size register. An example of a size register which can be used to implement this aspect of the present invention is illustrated in FIG. 8(a). Therein, it can be seen that specific bits are provided as flags which indicate whether or not each DRAM bank has a certain capacity. This information can then be supplied to, for example, the logic inputs of FIG. 7 as required. For example, in FIG. 7 both of AND gates 74 and 82 have a size input. These inputs can be supplied directly from the size register of FIG. 8. Since a bit is provided in the exemplary size register of FIG. 8(a) for every possible bank size, no decoding need be performed to generate bank size indications used in exemplary logic according to the present invention. This feature also aids in speeding up memory throughput.

Once the size of each of the DRAM banks has been determined, this information can also be used to determine which banks (if any) shall be configured as interleaved and the ranges of memory addresses which will be stored in each DRAM bank. Accordingly, FIG. 8(b) illustrates an exemplary interleaved-indicating register which provides bit flags which indicate whether or not either of the two bank pairs are interleaved, i.e., if both banks in the pair have the same capacity. This information is used, for example, on the input lines to gates 68 and 78 in the address generation logic of FIG. 7.

The address ranges which are supported by each DRAM bank are stored in a limit register associated with each bank. For example, FIGS. 8(c)–8(f) illustrate limit registers which could be used to store address limits for each of BANKS 0–3, respectively. An exemplary technique for assigning addresses to the physical DRAM banks in the address space according to the present invention is as follows. The lowest addresses in DRAM 30 will be assigned to the largest banks in decreasing order. Also, interleaved banks appear before non-interleaved banks having the same size. The base address is the address that is one higher than the highest address of the next lowest bank, except for 000000 (the first bank(s)). This base address is determined for each bank and stored in the corresponding limit register. Thus, the physical DRAM banks may not appear in sequence in the address space. Returning to FIGS. 3(a)–3(d), the column entitled "Base Memory Location (Limit Reg)" indicates the value of a bank stored in each of the corresponding limit registers when that bank is populated with the DRAM chips indicated in the column entitled "Physical Bank Size." For example, the table in FIG. 3(a) describes a 5 MB total DRAM size wherein BANK 0 is populated with a 1 MB SIMM, BANK 1 is unpopulated, BANK 2 is populated with a 4 MB SIMM, and BANK 3 is also unpopulated. In this example, since BANK 2 has the largest capacity, it is placed at the lower end of the address space as indicated by the 000000 value of its associated limit register. Since BANK 2 has a 4 MB size, the next bank to be placed in the address space is disposed at address 00100.

Other examples of limit register values can also be found in FIGS. 3(b)–3(d). For an interleaved case, e.g., that shown in FIG. 3(d), note that the interleaved bank pair 2 and 3 both have the same limit value since they jointly store a portion of the address space. Since BANKS 2 and 3 are assigned to the first 8 MB of the address space (because, as mentioned above, interleaved banks are assigned prior to non-interleaved banks of the same size), BANK 1 has a limit register value of 001000, i.e., corresponding to the portion of the address space beginning at the eighth megabyte. The limit register value is used in determining which bank (or banks in an interleaved case) is to be selected for each memory access. The selection of banks by bank select logic 42 will now be described with respect to FIG. 9.

Figure 9:
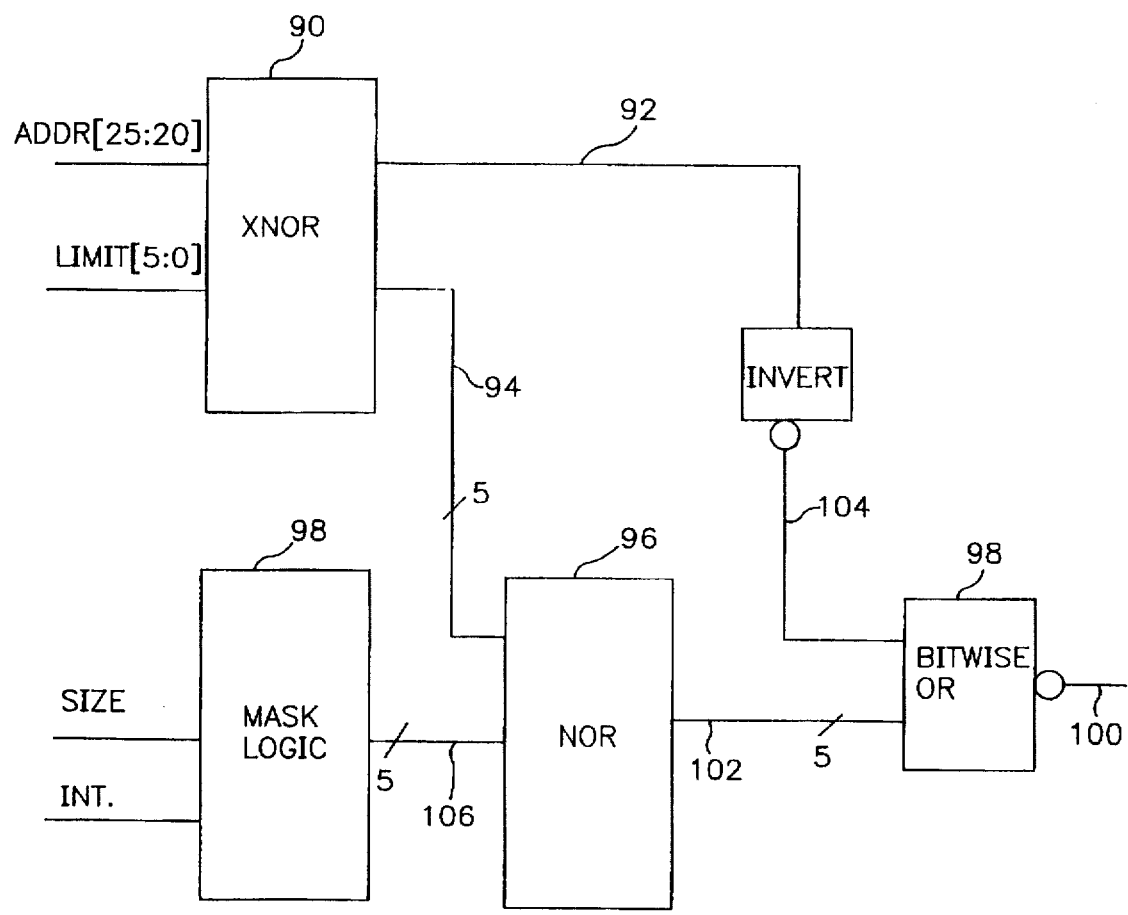
FIG. 9 is a block diagram of a branch of an exemplary bank select logic circuit according to an exemplary embodiment of the present invention.

FIG. 9 illustrates one of four branches which can be used to implement bank selection logic according to exemplary embodiments of the present invention. Each of the four branches corresponds to one of BANKS 0–3. Thus, if more banks are provided in a DRAM configuration, then additional logic circuits could also be provided. For the purposes of this example, the bank selection logic illustrated in FIG. 9 will be described with respect to BANK 0 although each of the other banks would correspond to a similar circuit. In FIG. 9, the bits 25-20 of the incoming system address are input to an exclusive NOR function 90. The other inputs to the exclusive NOR 90 are the contents of the limit register associated with the corresponding bank, in this example, BANK 0. These bits are compared to determine if the incoming address bits match the bits in BANK 0's limit register. The comparison is performed on a bit-wise basis and output upon signal lines 92 and 94 [4:0]. Signal line 92 provides the result of the compare for the high order address bit 25 since this bit is not ignored or masked during the determination of which bank is to be selected. The other four terms of the comparison are output on signal lines 94 [4:0] to a masking NOR function 96, since some or all of these bits may not be significant in determining the selection of a bank depending upon the size of the DRAM bank and the status of the DRAM bank as interleaved or non-interleaved. The mask logic 98 determines which of the bits provided on signal lines 94 [4:0] will be output from NOR function 96 by providing a pattern of 1's and/or 0's based upon the table shown in FIG. 10. Therein, a masking pattern is provided for each combination of bank size and bank status (interleaved or non-interleaved) to mask off insignificant bits which vary for these different combinations. This information is input to mask logic 98 from the size and interleave registers, e.g., FIGS. 8(a) and 8(b), respectively. The mask logic 98 outputs a 5-bit masking term as the second input to NOR function 96 by selecting the appropriate logic indicated by the table of FIG. 10. A pattern of all zeros on signal lines 102 indicates that the match determined by the exclusive nor function 90 is still valid. The 5 bits output from NOR function 96 and the 0 passed through signal line 92 are bit-wise ordered at block 98 to determine if the bank associated with this branch should be selected. A value of zero is output at line 100 if the bank associated with this circuitry is to be selected (as indicated by the bubble on block 98 indicating active low). Note that although true-low logic was used for this example, the particular type of logic used can be varied. In fact, the logic described herein may be implemented in either a hardwired manner or using software. In order to facilitate understanding of the circuitry illustrated in FIG. 9, an example will now be provided for both a non-interleaved and an interleaved case.

The first example will be provided using the exemplary non-interleaved configuration illustrated in FIG. 3(b). Suppose that the circuit of FIG. 9 is being used to determine whether or not the address 000010 sent from microprocessor 10 as part of a read or write instruction should result in the selection of BANK 1. Intuitively, one would expect BANK 1 to be selected since it includes the first 4 MB of the address space. Similarly, one would expect that an address of 000101 (i.e., somewhere within the sixth MB of the address space) would result in BANK 1 not being selected. In order to show these results and the operation of the circuit of FIG. 9, FIG. 9 is repeated as FIG. 11(a) with the exemplary values output from each of the block elements shown on the signal lines therein.

Figure 11A:
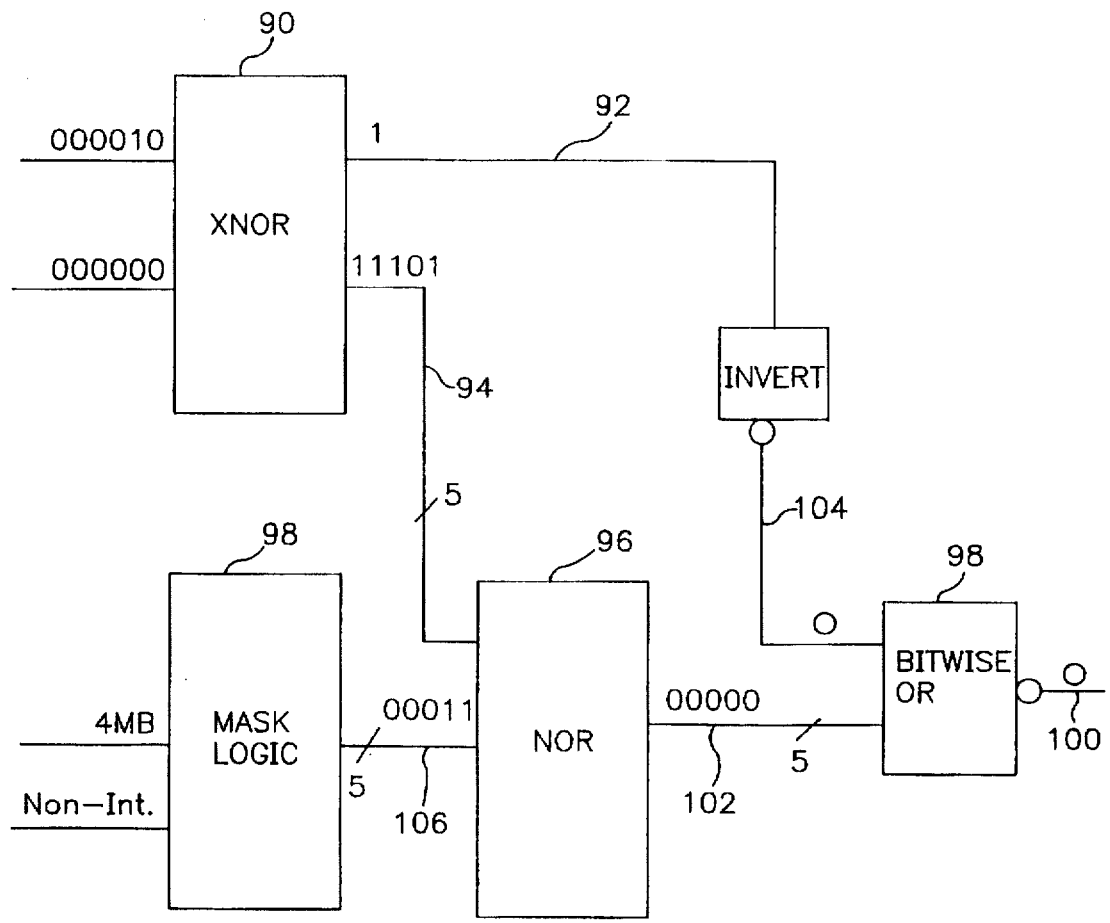
FIG. 11(a) provides a first, non-interleaved example of the operation of the bank select logic of FIG. 9.

As can be seen in FIG. 11(a), an address supplied to memory controller 20 is within the first two megabytes of the address space and the comparison at block 90 results in all but one of the address bits matching the bits in the limit register for BANK 1. However, since BANK 1 has a size of 4 megabytes, the two least significant bits is not significant for determining whether or not BANK 1 is to be selected. Accordingly, the mask value supplied on signal line 106 masks off the non-matching bit provided on signal line 94. Thus, the output of NOR function 96 on signal line 102 is all zeros and the bitwise OR results in an output of 0 on signal line 100 to indicate that BANK 1 should be selected for this case.

Figure 11B:
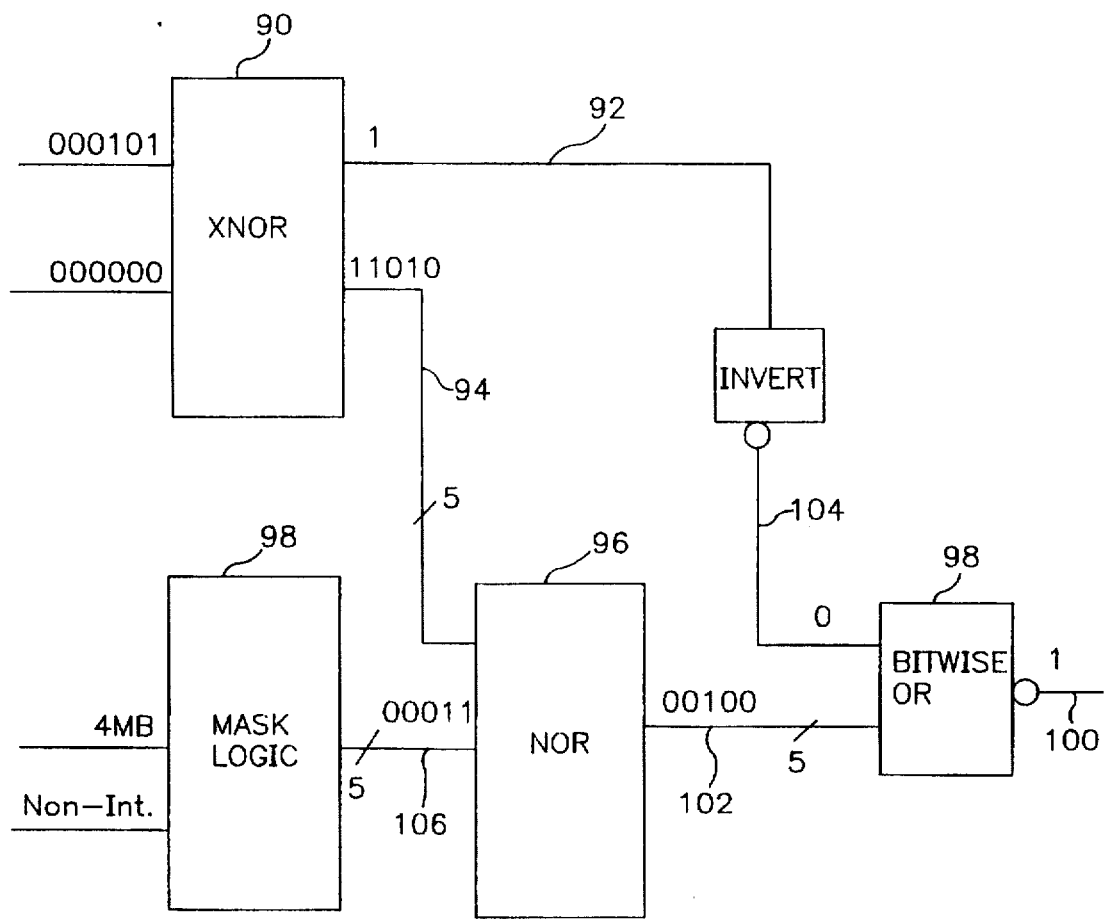
FIG. 11(b) provides a second, non-interleaved example of the operation of the bank select logic of FIG. 9.

Next, in FIG. 11(b), an address within the sixth megabyte of the address space is input to the exclusive NOR function block 90 along with the limit register value of BANK 1. However, the comparison on signal lines 94 changes to indicate that two bits now mismatch. Since one of the these bits is the third least significant bit, i.e., indicating that the address supplied by microprocessor 10 is beyond the fourth megabyte of the memory space, it is not masked off by the mask applied on signal line 106. This results in a logical '1' amongst the bits found on signal line 102 and, ultimately, in the bitwise OR outputting a 1 which is inverted to a 0 such that BANK 1 would not be selected for this case.

Figure 11C:
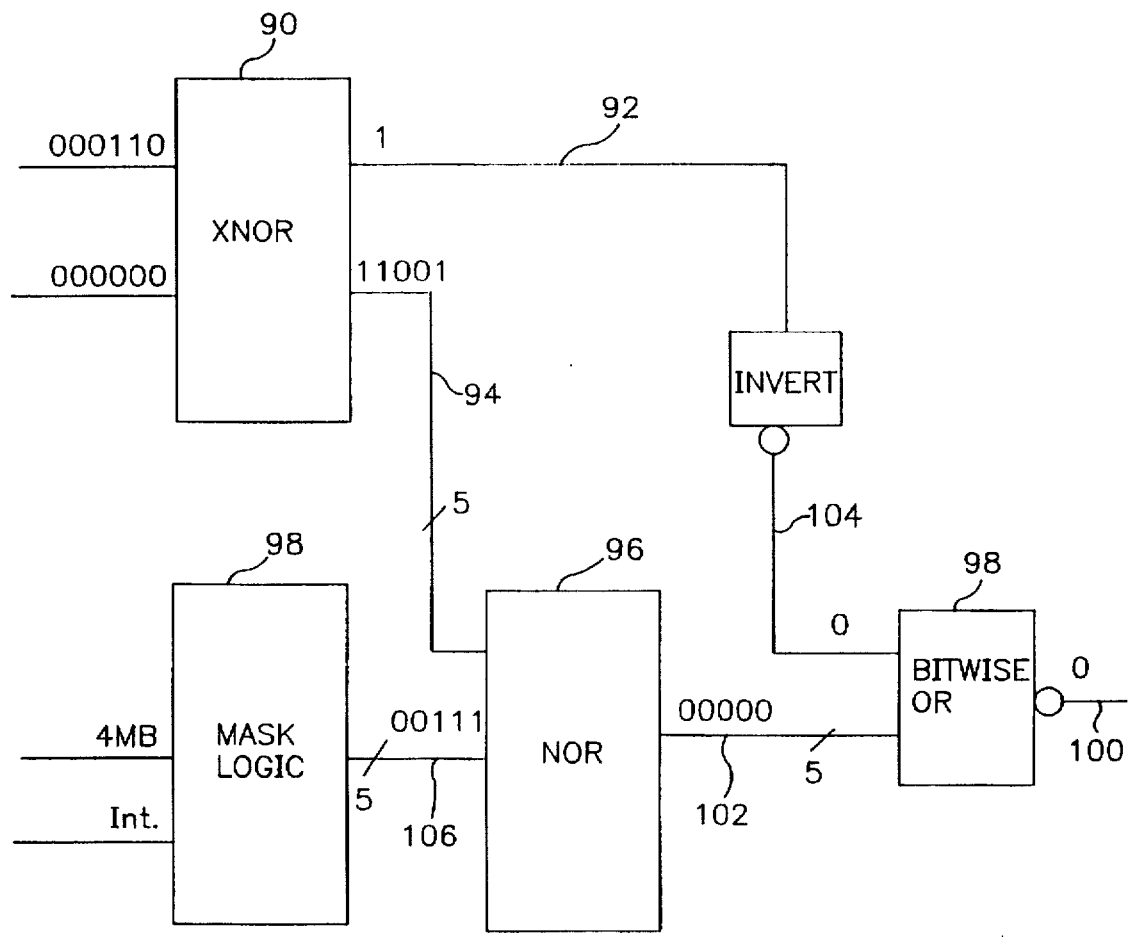
FIG. 11(c) provides a first, interleaved example of the operation of the bank select logic of FIG. 9.
Figure 11D:
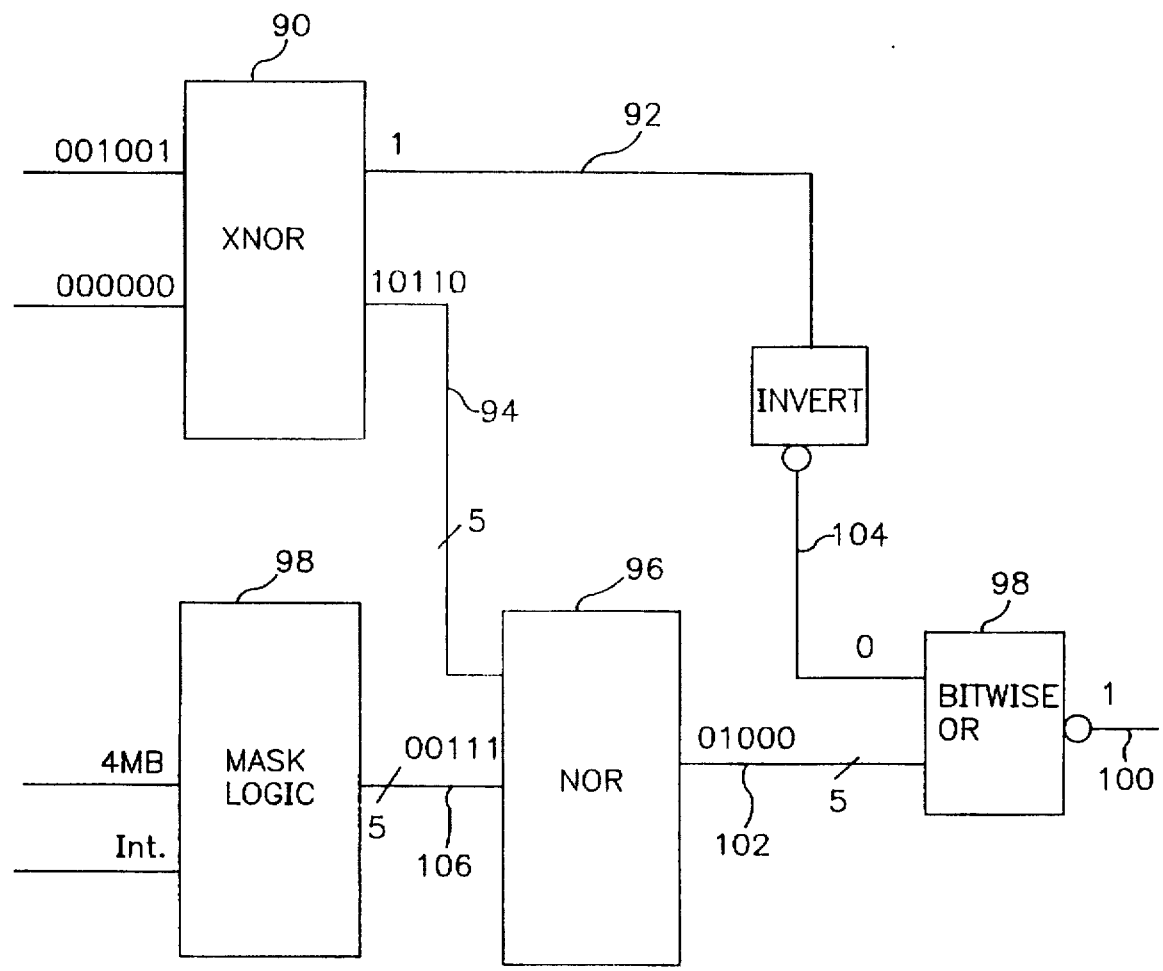
FIG. 11(d) provides a second, interleaved example of the operation of the bank select logic of FIG. 9.

As an example of bank selection for an interleaved memory case, consider the example of FIG. 3(c) wherein BANKS 0 and 1 are interleaved. Note that in FIG. 3(c) since the BANKS 0 and 1 are interleaved, a limit register provides the same limit, in this case, 00000, for both of those banks. Thus, looking at FIG. 11(c), it is apparent that since all of the inputs to this circuit will be the same for both BANKS 0 and 1, the output will be the same, i.e., either both banks will be selected or neither will be selected. Accordingly, the exemplary values set forth below in FIG. 11(c) can be said to describe the operation for the circuit for both branches of the bank selection logic 42 associated with BANK 0 and BANK 1, respectively. Therein, a first input address is provided within the seventh megabyte, which one would expect to result in both banks being selected since the two, 4 MB interleaved banks jointly store the first 8 MB of the address space. The example shown in FIG. 11(d) illustrates a bank selection for the same configuration (i.e., that of FIG. 3(c)), but wherein the input address within the tenth megabyte which, as expected, results in neither BANK 0 nor BANK 1 being selected.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What I claim is:

1. A memory system comprising:
   a plurality of memory banks, at least two of which are associated with one another for one of interleaved and non-interleaved operation;
   a memory controller including:
   a size register for storing a size of each of said plurality of memory banks;
   an interleave register for storing a status of each of said memory banks as interleaved or non-interleaved based upon said size of said respective memory bank;
   a limit register associated with each of said memory banks for storing a base memory address assigned to each of said memory banks based upon said size and said status of each of said memory banks;

bank selection logic which identifies at least one of said memory banks based upon an input system address and said size, said status and said base memory address of each of said memory banks; and address generation logic which generates a row address based upon said input system address irrespective of said status of said each of said memory banks and which generates a column address based upon both said input system address and said status.

2. The memory system of claim 1, wherein said memory banks comprise DRAM chips.

3. The memory system of claim 1, wherein each of said memory banks is a SIMM.

4. The memory system of claim 1, wherein said bank selection logic further comprises:

a comparator for comparing bits of said input system address with said base memory address of one of said plurality of memory banks and generating an output indicative thereof.

5. The memory system of claim 4, wherein said bank selection logic further comprises:

masking logic for masking insignificant bits in said output based upon said size and said status of said one of said plurality of memory banks.

6. A method for selecting at least one of a plurality of memory banks in response to an input system address comprising the steps of:

comparing bits of said system address with bits of a base system address for each of said plurality of memory banks to generate a plurality of match bits;

determining which of said match bits are significant in selecting said at least one of said plurality of memory banks;

masking match bits which are insignificant using masking bits selected based upon memory bank size and interleave status; and selecting said at least one of said plurality of memory banks using bits output from said masking step.

7. Memory bank selection logic comprising:

a register for storing a base memory address associated with a memory bank;

a comparator for comparing a system address with said base memory address and outputting a matching signal;

a mask logic circuit for generating a pattern of mask bits based on a size of said memory bank and an interleave status of said memory bank, wherein said pattern of mask bits is used by a masking circuit for selectively masking bits in said matching signal; and logic for determining if said memory bank is to be selected based upon an output of said masking circuit.

8. The bank selection logic of claim 7, wherein said logic for determining if said memory bank is to be selected based upon an output of said masking circuit comprises a bitwise OR function.

9. The memory bank selection logic of claim 7, wherein said pattern of mask bits differs depending on whether the interleave status reflects that an interleave mode is enabled or disabled.

* * * * *